(12) United States Patent
Shusterman et al.

(10) Patent No.: US 7,355,417 B1
(45) Date of Patent: Apr. 8, 2008

(54) TECHNIQUES FOR OBTAINING ELECTROMAGNETIC DATA FROM A CIRCUIT BOARD

(75) Inventors: Boris Shusterman, Southborough, MA (US); Tomer Jackman, Marlborough, MA (US)

(73) Assignee: EMC Corporation, Hopkinton, MA (US)

( * ) Notice: Subject to any disclaimer, the term of this patent is extended or adjusted under 35 U.S.C. 154(b) by 138 days.

(21) Appl. No.: 11/230,706

(22) Filed: Sep. 20, 2005

(51) Int. Cl.
*G01R 31/28* (2006.01)
(52) U.S. Cl. .................................. 324/750; 324/765
(58) Field of Classification Search ........................ None
See application file for complete search history.

(56) References Cited

U.S. PATENT DOCUMENTS

| | | | | |
|---|---|---|---|---|
| 3,463,007 A | * | 8/1969 | Jones et al. ................ 374/124 |
| 3,760,271 A | * | 9/1973 | Bach et al. ................ 324/95 |
| 3,931,573 A | * | 1/1976 | Hopfer ................ 324/106 |
| 3,992,663 A | * | 11/1976 | Seddick ................ 324/529 |
| 4,527,119 A | * | 7/1985 | Rogers et al. ............. 324/758 |
| 4,565,966 A | * | 1/1986 | Burr et al. ................ 324/519 |
| 4,565,967 A | * | 1/1986 | Eisenbrandt et al. ......... 324/95 |
| 5,107,206 A | * | 4/1992 | Yanagi et al. ............. 324/754 |
| 5,469,064 A | * | 11/1995 | Kerschner et al. ........... 324/537 |
| 5,517,110 A | * | 5/1996 | Soiferman ................ 324/158.1 |
| 5,714,888 A | * | 2/1998 | Naujoks ................ 324/750 |
| 6,160,517 A | | 12/2000 | Bell et al. ................ 343/703 |
| 6,268,719 B1 | * | 7/2001 | Swart ................ 324/158.1 |
| 6,268,738 B1 | | 7/2001 | Gunthorpe et al. ......... 324/750 |

\* cited by examiner

*Primary Examiner*—Ernest Karlsen
(74) *Attorney, Agent, or Firm*—BainwoodHuang

(57) ABSTRACT

A system is configured to obtain electromagnetic data from a circuit board. A set of sensing locations resides in a plane which is substantially parallel to the circuit board. The system includes a probe, a robotic assembly coupled to the probe, and a controller coupled to the probe and the robotic assembly. The controller is configured to move the probe to various sensing locations (e.g., a two-dimensional grid of sensing locations) and collect electromagnetic data from these sensing locations. The controller is further configured to provide an electromagnetic data output based on the collected electromagnetic data. The controller is further configured to direct the probe (or an adjacent probe) to emit electromagnetic interference at these locations in order to determine the effect of such interference on circuit board operation.

22 Claims, 5 Drawing Sheets

TECHNIQUES FOR OBTAINING ELECTROMAGNETIC DATA FROM A CIRCUIT BOARD

BACKGROUND

Electronic systems typically include printed circuit board (PCB) assemblies having assortments of electronic components (e.g., high speed processors, memory devices, interface modules, etc.). Electronic components emit electromagnetic waves, also referred to as electromagnetic interference (EMI). If this EMI is not kept to acceptable levels (e.g., as defined by various agencies such as FCC in the USA and organizations responsible for control of RF spectrum in other countries) the PCB assemblies may cause malfunctions within the systems and to other systems in the vicinity. For example, an EMI interference produced by a PCB assembly may corrupt data handled by an adjacent PCB assembly within the same electronic system thus causing the overall operation of that system to fail. Furthermore, if the manufacturer of the electronic system cannot equip the system so that it passes required Radio-Frequency emissions testing, the electronic system is not permitted for sale.

A conventional scanning apparatus is available which helps circuit board manufacturers examine the EMI characteristics of a circuit board assembly. This apparatus includes (i) a rectangular plate which contains an array of probes, and (ii) multiple processors which are configured to scan for EMI emissions using the array of probes. The array of probes includes a high number of magnetic field pickup probes arranged in a grid with each probe being controlled through a complex switching scheme by a dedicated processor. The probes of the array are calibrated for precise EMI scanning within a very limited frequency range.

During operation, a technician connects the rectangular plate containing the array of probes to the processing devices. The technician then places the rectangular plate adjacent the circuit board assembly under test, and directs the processing devices to scan for EMI emissions from the circuit board assembly using the array of probes. If the technician subsequently wishes to scan for EMI emissions in a different frequency range, the technician replaces the initial rectangular plate containing the array of probes with a new rectangular plate having a different array of probes which is calibrated for operation at the different frequency range.

SUMMARY

Unfortunately, there are deficiencies to the above-described conventional scanning apparatus which is configured to examine EMI characteristics of a circuit board assembly. For example, the above-described rectangular plate which contains the array of probes is a complex and expensive apparatus. If one of the probes within the array were to fail, significant time and effort could be required to replace the failed probe.

Additionally, for circuit board assemblies larger than the array of probes, the array of probes may not completely cover the total surface area of the circuit board assemblies. In such situations, the scanning apparatus is only able to partially scan these circuit board assemblies.

Furthermore, each array of probes is configured to scan in a very narrow frequency range. Accordingly, in order to scan across multiple frequency ranges, the technician must possess multiple arrays of probes which is a very costly and burdensome endeavor.

In contrast to the above-described conventional scanning apparatus which uses a complex rectangular plate containing an array of probes, improved technique utilize a single probe which is capable of being moved in an automated manner (e.g., by robotic equipment) over multiple sensing locations relative to a circuit board under test. The use of the single probe alleviates the burden of having to deal with a conventional expensive and complex array of probes which is difficult to repair if one of the probes of the array were to fail. Additionally, the single probe does not limit the area of coverage, i.e., robotic equipment responsible for positioning the single probe can be easily configured to cover any size circuit board. Furthermore, in contrast to a conventional approach of using an array of probes where the size of the probes dictate the frequency response, the improved techniques which use a single probe are not hindered because these improved techniques can easily employ any size of probe.

One embodiment is directed to a system for obtaining electromagnetic data from a circuit board. A set of sensing locations resides in a plane which is substantially parallel to the circuit board. The system includes a probe, a robotic assembly coupled to the probe, and a controller coupled to the probe and the robotic assembly. The controller is configured to move the probe to various sensing locations (e.g., a two-dimensional grid of sensing locations) and/or rotate the probe in any desired angle, and collect electromagnetic data from these sensing locations. The controller is further configured to provide an electromagnetic data output based on the collected electromagnetic data.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Improved techniques for obtaining electromagnetic data utilize a single probe which is capable of being moved in an automated manner (e.g., by robotic equipment) over multiple sensing locations relative to a circuit board under test. The use of the single probe alleviates the burden of having to deal with a conventional expensive and complex array of probes which is difficult to repair if one of the probes of the array were to fail. Additionally, the single probe does not limit the area of coverage, e.g., robotic equipment responsible for positioning the single probe can be easily configured to cover any size circuit board. Moreover, in contrast to a conventional approach of using an array of probes where the size of the probes dictate the frequency response, the improved techniques which use a single probe are not hindered because these improved techniques can easily employ any size of probe.

Figure 1:
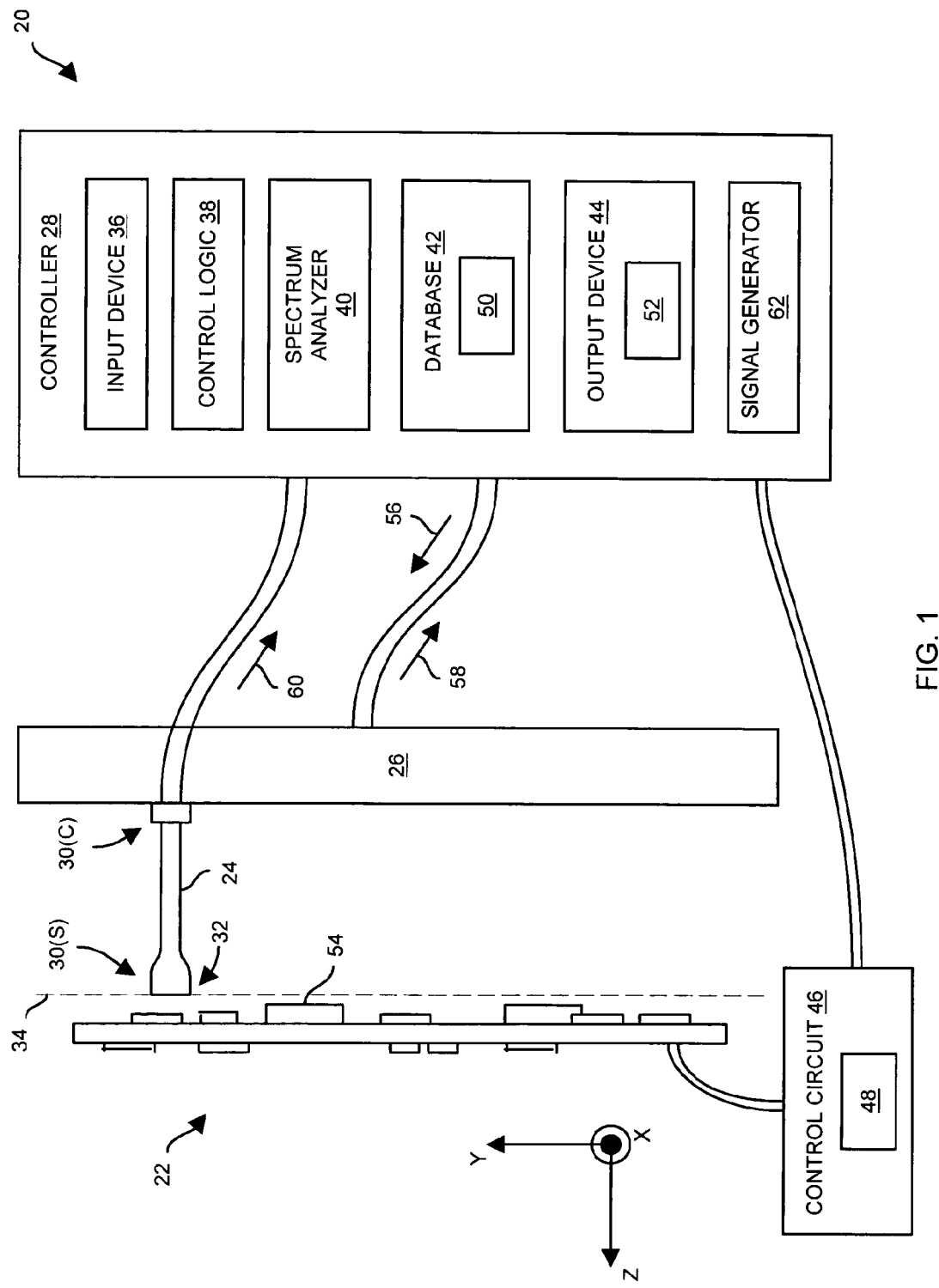
FIG. 1 is a general diagram of a system for obtaining electromagnetic data from a circuit board under test.

FIG. 1 shows a system 20 which is configured to obtain electromagnetic data from a circuit board 22. For illustration purposes, the circuit board 22 is shown in FIG. 1 as extending along the X-Y plane. The system 20 includes a probe 24, a robotic assembly 26 and a controller 28. The probe 24 has a connecting end 30(C) and a sensing end 30(S). The connecting end 30(C) is configured to physically couple to the robotic assembly 26, and electronically couples to the controller 28 (illustrated in FIG. 1 by a cable which interconnects the probe end 30(C) with the controller 28). The sensing end 30(S) is configured to reside at various sensing locations (or scanning cells) 32 within a two-dimensional array 34 (e.g., a two-dimensional grid which is substantially parallel to the circuit board 22 in the X-Y plane) in response to movement by the robotic assembly 26.

The controller 28 includes an input device 36, control logic 38, a spectrum analyzer 40, a database 42, an output device 44 and a circuit board control circuit 46. The input device 36 is configured to receive commands from a user. The control logic 38 is capable of directing the operation of the probe 24, the robotic assembly 26, the spectrum analyzer 40, the database 42, the output device 44 and the circuit board control circuit 46 in response to these commands. In particular, the control logic 38 is configured to direct the control circuit 46 to exercise the circuit board 22. In some arrangements, the circuit board 22 is capable of performing a variety of operations and the control circuit 46 guides the circuit board 22 to repetitively execute a predefined script 48, e.g., a series of operations intended to simulate normal or worst case operation of the circuit board 22. The control logic 38 is further configured to (i) actuate the robotic assembly 26 and thus position the probe 24 at the various sensing locations 32, and (ii) direct the spectrum analyzer 40 to read electromagnetic emissions from the circuit board 22 using the probe 24 while the circuit board 22 runs the script 48. In this manner, the controller 28 collects electromagnetic data 50 and stores this data 50 in the database 42.

Later on, the controller 28 is configured to access the database 42 and render an electromagnetic data output 52 on the output device 44 (e.g., an electronic display, a printer, etc.) based on the collected stored electromagnetic data 50. A user is then capable of using this output 52 to identify EMI sources on the circuit board 22 (e.g., particularly problematic circuit board components 54).

It should be understood that the robotic assembly 26 is configured to move the end 30(S) of the probe 24 to each of the sensing locations 32 of the array 34 in response to an actuation signal 56 from the control logic 38 of the controller 28. As the robotic assembly 26 moves the probe 24, the robotic assembly 26 sends back to the control logic 38 a confirmation signal 58 identifying the precise position of the probe 24, i.e., the location of the probe end 30(S) within an X-Y coordinate system of the array 34. Accordingly, the control logic 38 is able to accurately position the probe 24, and receive an EMI data signal 60 from the probe 24 to record a profile of electromagnetic emissions at each sensing location 32.

In some arrangements, the control logic 38 performs this series of probe movements and data recording operations in a step-by-step methodical manner until EMI data is obtained for each sensing location 32. That is, the controller 28 directs the robotic assembly 26 to move the probe 24 to a first sensing location 32 residing in the array 34 and collects first electromagnetic data 50 using the probe 24. The controller 28 then directs the robotic assembly 26 to move the probe 24 from the first sensing location 32 to a second sensing location 32 residing in the plane and collects second electromagnetic data 50 using the probe 24, and so on. During the scan of each sensing location 32, the spectrum analyzer 40 senses a maximum amplitude for each frequency over a frequency range for a predetermined amount of time. Preferably, this amount of time is at least as long as the amount of time it takes for the circuit board 22 to run the entire script 48 of operations thus ensuring that each operation within the script 48 runs at least once during the EMI monitoring time window. Further details will now be provided with reference to FIGS. 2 and 3.

Figure 2:
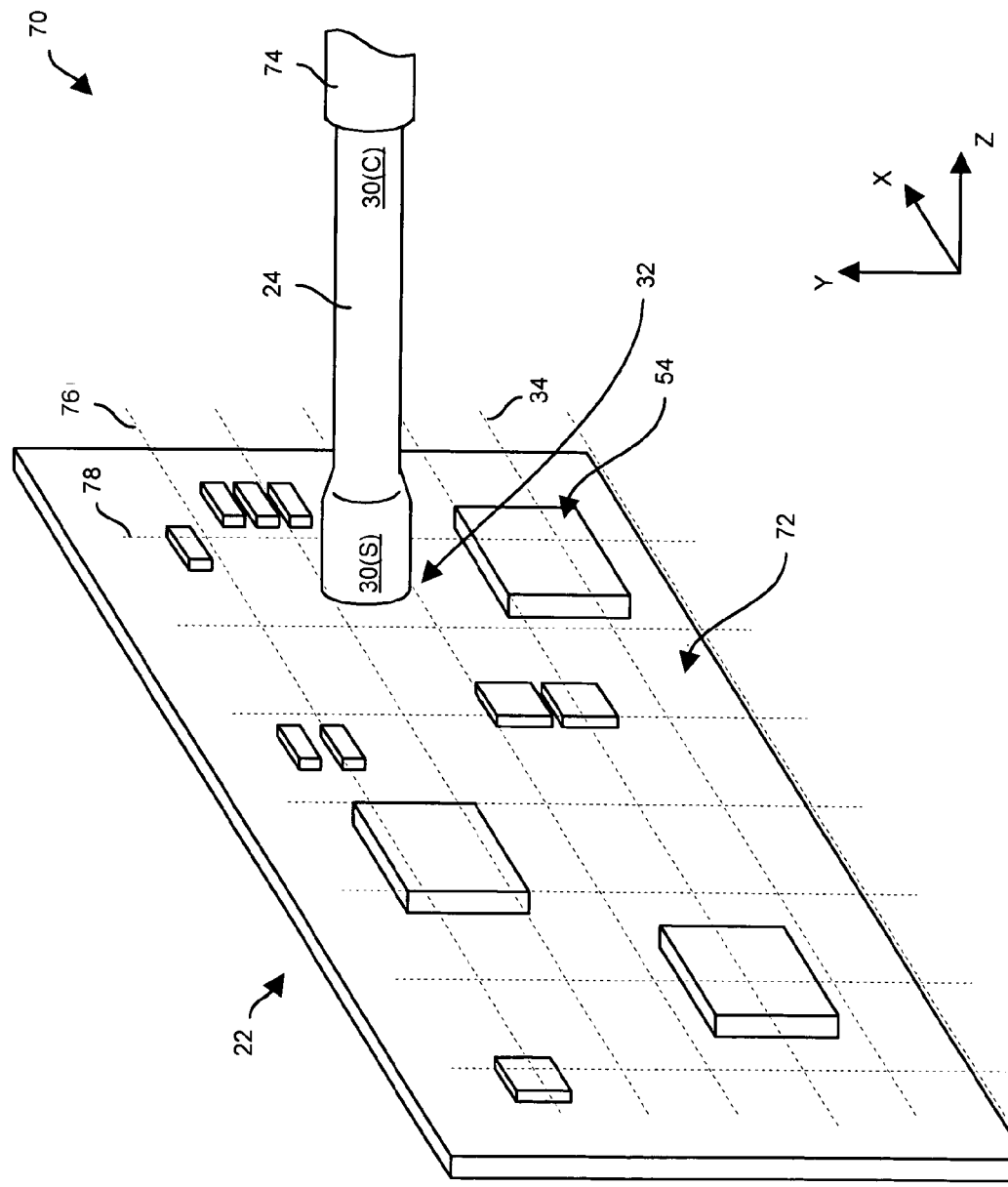
FIG. 2 is a perspective view of a probe of the system when the probe is located at a sensing location relative to the circuit board under test.
Figure 3:
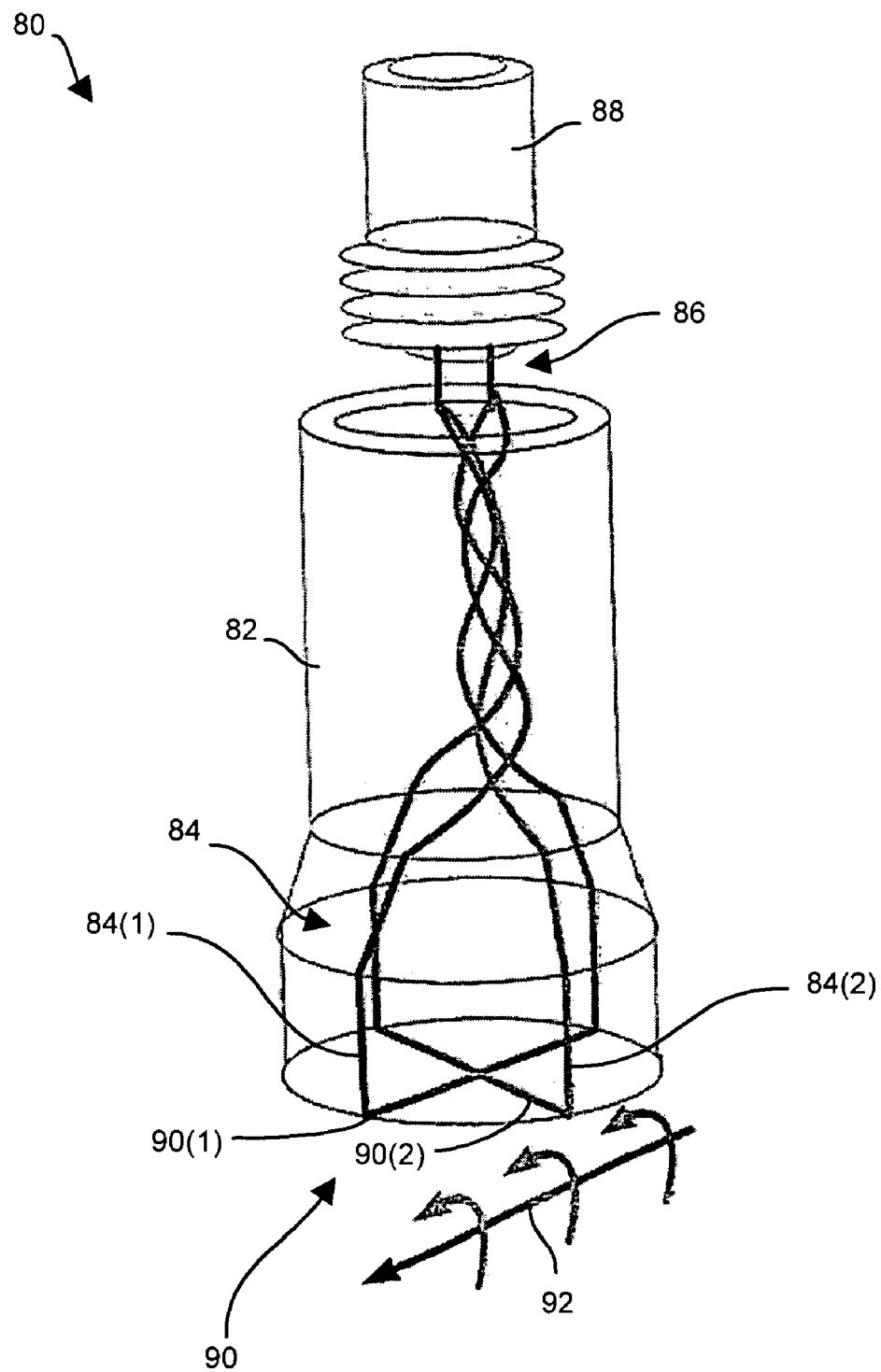
FIG. 3 is a detailed view of particular features of the probe of FIG. 2.

FIG. 2 is a perspective view 70 of the probe 24 relative to a sensing location 32 of the array 34 when sensing EMI emissions from the circuit board 22, and FIG. 3 is a detailed view 80 of particular features of the probe 24. As shown in FIGS. 2 and 3, the end 30(S) of the probe 24 is relatively flat and thus enables the end 30(S) to reside close to the various components 54 of the circuit board 22 (e.g., high frequency modules, integrated circuits, discrete components, conductive traces, plated through holes, etc.).

In some arrangements, the robot assembly 26 (also see FIG. 1) is configured to position the probe 24 so that the end 30(S) resides at a fixed distance from the component mounting surface 72 of the circuit board 22. Such a distance is capable of being set by a user to be any amount. For example, a desired distance is capable of being set so that the end 30(S) barely clears the top of the tallest component 54 in the Z-direction (e.g., 0.125 inches from the tallest component 54 in the Z-direction). As another example, if the circuit board 22 is configured to reside in a card cage adjacent to other circuit boards, this distance is set so that the end 30(S) nominally resides at the same distance as that of a neighboring circuit board 22 when the circuit board 22 is installed within such a card cage environment. Recording the field strength emanated by a board under investigation at the distance where an adjacent board is located in a system assembly allows evaluation of the sensitivity of that adjacent board later on, using the recorded data. A similar probe can be attached to the source of RF signal and calibrated to produce the same signal strength at the given distance as previously recorded.

As shown in FIG. 2, the connecting end 30(C) of the probe 24 attaches to a robotic arm 74 of the robotic assembly 26. To scan the entire circuit board 22, the robotic assembly 26 moves the probe 24 so that the sensing probe end 30(S) journeys from one sensing location 32 of the array 34 to another. In some arrangements, the probe 24 stops at each location 32 along a row 76 (i.e., along the X-axis) before proceeding to the next row 76 in methodical fashion. In other arrangements, the probe 24 stops at each location 32 along a column 78 (i.e., along the Y-axis) before proceeding to the next column 78.

As shown in FIG. 3, the probe 24 includes a base 82, and multiple sensing windings 84(1), 84(2) (collectively, sensing windings 84) which are electrically insulated from each other, connecting in parallel at the interface connector, only. The base 82 is configured as a hollow metallic chamber which contains the lead ends 86 of the sense windings 84. By way of example, the lead ends 86 terminate at a coaxial connector 88 (a BNC connector is shown as an example, it can be an SMA or other type of connector) which is configured to connect to a coaxial cable leading to the controller 28 (also see FIG. 1). The sensing ends 90 of the sense windings 84 are exposed at an opening 92 of the base

82. Specifically, a flat sensing portion 90(1) of the sense winding 84(1) is substantially orthogonal to a flat sensing portion 90(2) of the sensing winding 84(2). These flat sensing portions 90(1), 90(2) lie substantially within the X-Y plane. In contrast to conventional convex shaped probes, the flatness of the sensing portions 90(1), 90(2) enables better coupling of magnetic fields and truer sensing of EMI emissions from the various sensing locations 32, i.e., the right hand rule operates on straight conductors 92. Further details will now be provided with reference to FIG. 4.

Figure 4:
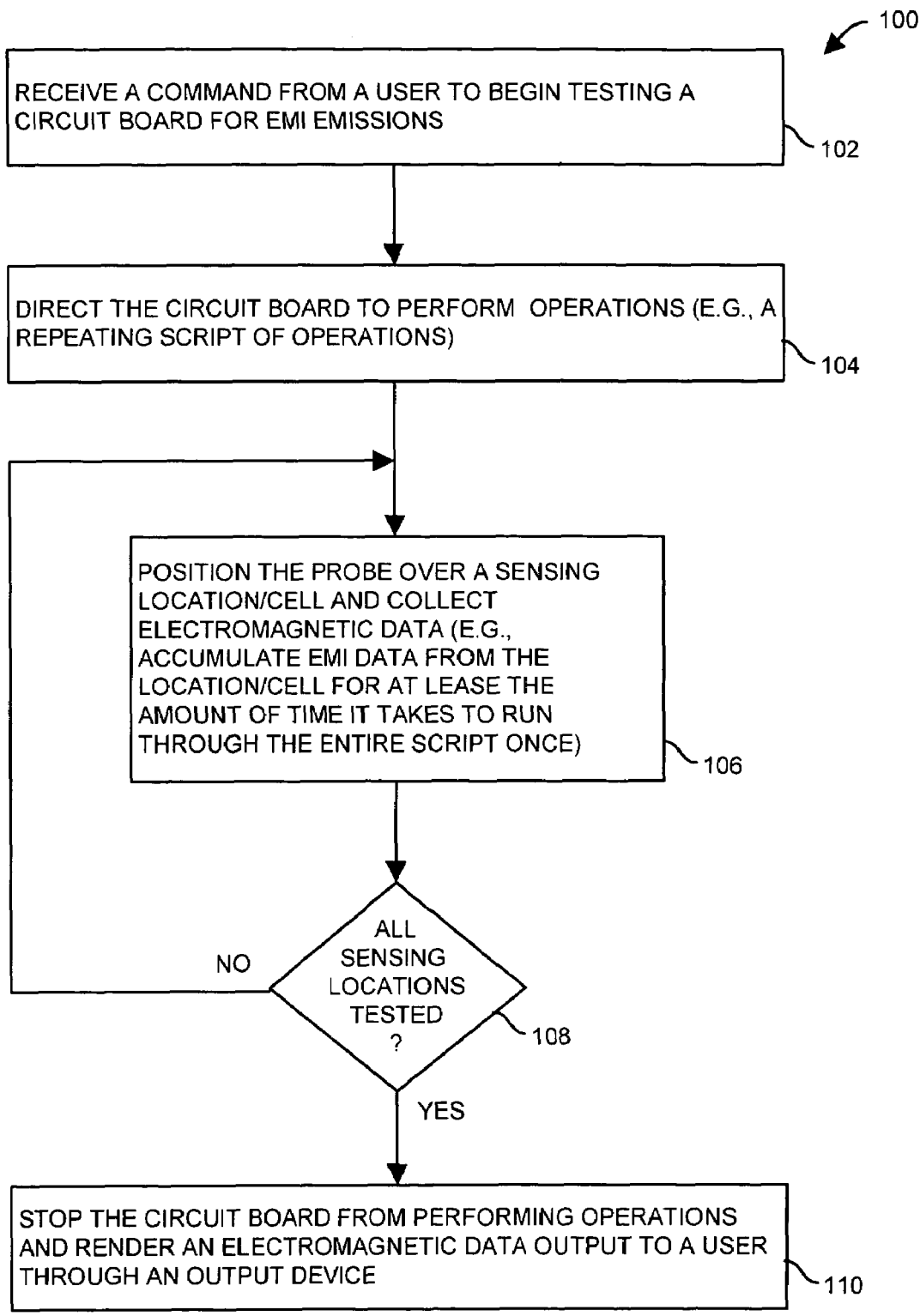
FIG. 4 is a flowchart of a procedure which is performed by a controller of the system of FIG. 1.

FIG. 4 is a flowchart of a procedure 100 which is performed by the controller 28 during operation of the system 20. In step 102, the controller 28 receives a user command to begin testing the circuit board 22 for EMI emissions.

In step 104, the controller 28 directs the circuit board 22 to perform a repeating series of operations, e.g., see the script 48 of the circuit board control circuit 46 in FIG. 1. At this point, the circuit board 22 is up and running and is a source of EMI.

In step 106, the controller 28 moves the end 30(S) of the probe 24 to a sensing location 32 and collects electromagnetic data at the end 30(S) of the probe 24. In particular, the control logic 38 sends the actuator signal 56 to the robotic assembly 26 and receives, as feedback, the confirmation signal 58 from the robotic assembly 26 to confirm proper positioning of the probe 24. As the robotic assembly 26 holds the probe 24 still over the sensing location 32, the control logic 38 directs the spectrum analyzer 40 to measure EMI emissions for a period of time and across a preset range of frequencies. In some arrangements, the spectrum analyzer 40 stores, as the electromagnetic data 50 in the database 42 (FIG. 1), the maximum amplitude of signals measured at each frequency in the range. The period of time is long enough to guarantee that every operation in the script 48 has executed at least once. The analyzer constantly updates the maximum amplitude of each signal while the probe is positioned over a certain cell.

In step 108, the controller 28 determines whether there remains an untested sensing location 32 in the array 34. If so, the controller repeats step 106 to sense EMI from another sensing location 32. However, if all of the sensing locations 32 have been tested, the controller 28 proceeds to step 110.

In step 110, the controller 28 stops the circuit board 22 from repeating the series of operations and makes the collected electromagnetic data output 52 available for user access on the output device 44. In particular, the output device 44 (e.g., a display) is capable of rendering a set of images showing the maximum amplitudes of electromagnetic emissions (i.e., emission high points) collected at each sensing location 32 at any frequency in the frequency range.

At this point, if desired, the procedure 100 can be repeated using a different probe 24 which is configured to sense at a different preset frequency range. Such a feature enables accurate monitoring of EMI without having the burden of sensing a circuit board using conventional complex probe arrays.

Figure 5:
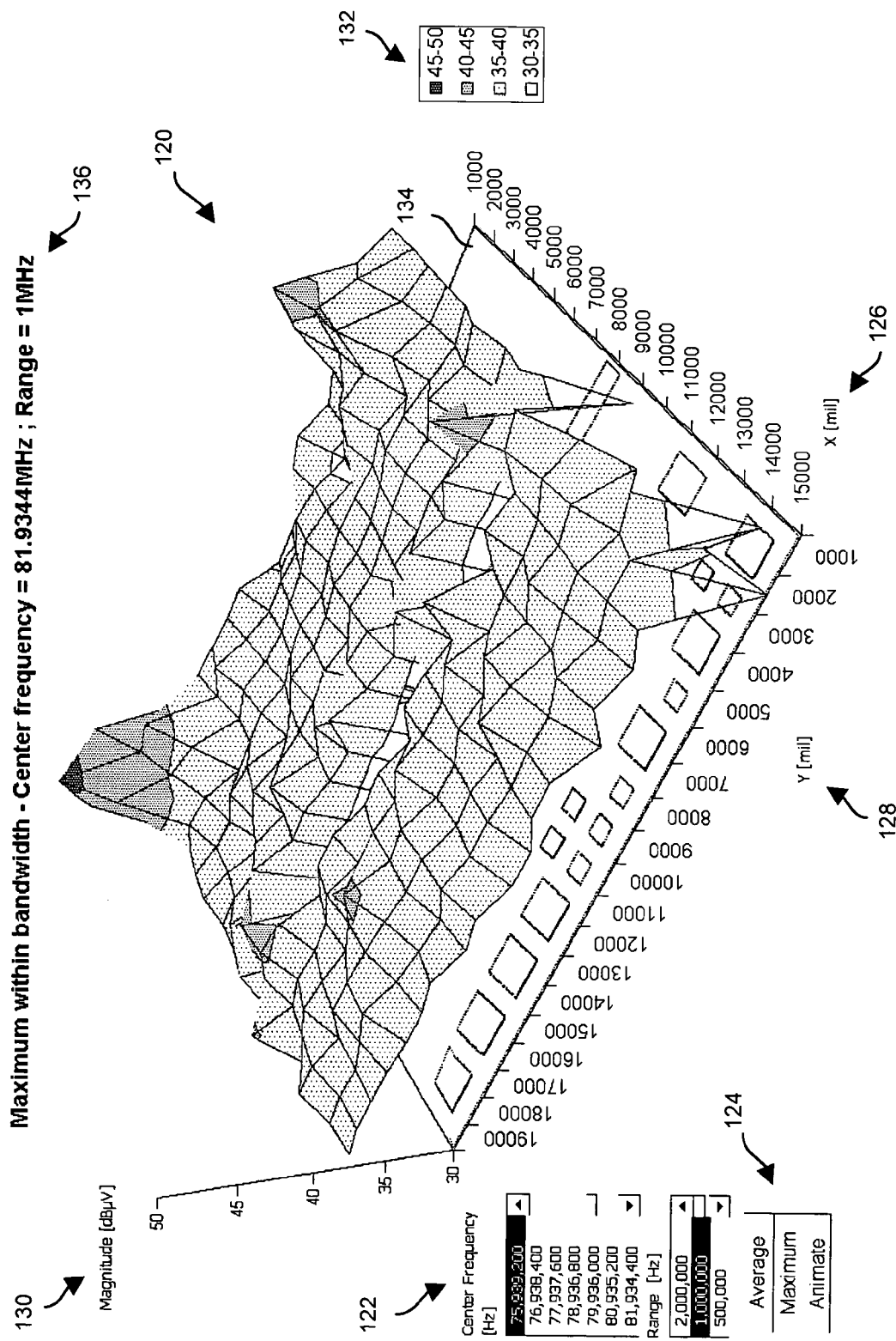
FIG. 5 is a diagram illustrating an electromagnetic data output provided by the system of FIG. 1.

FIG. 5 is a diagram 120 illustrating an electromagnetic data output 52 provided by the system 20 on the output device 44. The output 52 graphically shows the maximum recorded amplitude for each sensing location 32 over the circuit board 22 at a particular center frequency (e.g., 81.9344 MHz) with a particular frequency range (e.g., 1 MHz). A user is capable of viewing the maximum recorded amplitude for each sensing location 32 over the circuit board 22 at a different center frequency by selecting the different center frequency and frequency range value from a menu 122 (e.g., using a computer mouse of the input device 36, also see FIG. 1). Other outputs are available as well from other menus 124 and are selectable by the user such as the average amplitudes which is the summation of all of the maximum amplitudes at each frequency in order to illustrate the largest EMI sources overall. Furthermore, the user is capable of selecting an animate feature which sequentially displays multiple electromagnetic data outputs 52 at different center frequencies to assist the user in seeing how the EMI emission character of the circuit board 22 changes for different frequencies.

It should be understood that the layout for the EMI data 50 is capable of taking on a variety of appearances. In the diagram 120, the X-axis (reference numeral 126) and Y-axis (reference numeral 128) refer to spatial (X, Y) coordinates (e.g., in mils) of a circuit board. The Z-axis (reference numeral 130) refers to magnitude of measured EMI (e.g., in dBuV). A shaded or colored legend 132 further indicates magnitude of the measured EMI. Such information is capable of being overlaid over an image 134 of the circuit board 22 (e.g., a true image, a block diagram representation, etc.) in order to illustrate which components are likely problematic sources of EMI. A title 136 is capable of indicating particular aspects of the displayed data 50. Such a presentation of provides the data 50 in a meaningful and effective manner thus enabling the user to easily identify sources of significant EMI.

As mentioned above, improved techniques for obtaining electromagnetic data utilize a single probe 24 which is capable of being moved in an automated manner (e.g., by robotic equipment 26) over multiple sensing locations 32 relative to a circuit board 22 under test. The use of the single probe 24 alleviates the burden of having to deal with a conventional complex array of probes which could be difficult to repair if one of the probes of the array were to fail. Additionally, the single probe 24 does not limit the area of coverage, e.g., the robotic equipment 26 responsible for positioning the single probe 24 can be easily configured to cover any size circuit board. Furthermore, the burden of carrying multiple single probes 24 which can be interchanged in order to scan at different frequency ranges is far less burdensome than the conventional burden of carrying multiple complex and expensive arrays of probes.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the system 20 is entirely flexible and capable of being configured to position the probe 24 at virtually any position within the X-Y plane. As a result, the pitch of the testing grid is changeable (e.g., to a finer grid, to a coarser grid, etc.) for different levels of information. At each cell 32, the system 20 is nevertheless fully capable of accumulating information on the spectrum emanated by the circuit board 22 (e.g., circuitry, traces, etc.) passing through that cell 32. The resolution of the process is determined by the size of the probe 24 and its characteristics (e.g., winding size), as well as the size of the individual cells 32 of the array 34. The spectrum analyzer 40 evaluates each cell 32 in separate frequency ranges, from lowest to highest thus enabling complete control of resolution where it is necessary.

Additionally, it should be understood that the two orthogonal probe windings 84 alleviate the need to scan the circuit board 22 twice. Rather, the probe can pick up signals in any orientation by having the two orthogonal windings. If the signal picked up 92 is parallel to winding 90(1), and therefore perpendicular to winding 90(2), only winding 90(1) will pick it up. Likewise, if the signal picked up 92 is parallel to winding 90(2), and therefore perpendicular to winding 90(1), only winding 90(2) will pick it up. If the signal 92 is in any angle that is not perpendicular to windings 90(1) and 90(2), each one of the two windings 90(1) and 90(2) will pick up a portion of the signal, and the combined value will reflect the intensity of the signal being probed 92.

Furthermore, the orthogonally positioned sense wires provide maximum sensitivity from PCB etch runs aligned with them. In order to sense RF emissions from the etch runs placed at 45 degrees the probe 24 is capable being rotated to obtain the optimum sensitivity in that direction utilizing simple robot control options. In particular, the earlier-described actuation signal 56 from the control logic 38 is capable of directing the robotic assembly 26 to rotate the probe 24 to any desired angle, and the earlier-described confirmation signal 58 from the robotic assembly 26 is capable of informing the control logic 38 of the angular orientation of the probe 24 in a feedback loop manner (also see FIG. 1).

Additionally, it should be understood that the system 20 is fully capable of injecting electromagnetic interference to a circuit board, i.e., the system 20 operates as an RF injection tool. Along these lines, the probe 24 (or another probe adjacent the probe 24) travels through the various locations 32 of the array 34 (also see FIG. 2). At each location 32, the controller 28 directs the probe 24 to emit electromagnetic interference to that location 32. A predetermined database (e.g., see the database 42 in FIG. 1) identifies to the control logic 28 locations for RF injection, emissions levels, frequency and polarity, among other things. Accordingly, the controller 28 by means of signal generator 62 and database 42 (FIG. 1) can generate a predetermined interference through the probe 24 to determine its influence on circuit board operation. All of this is done while the circuit board 22 is running code, and the result is recorded by a control mechanism. In particular, the control circuit 46 (FIG. 1) is configured to monitor the board under test 22 for any abnormality in its function or performance. If the board should fail under this condition, then it will be flagged as susceptible to that level of emission in that frequency and magnitude for that point. As a result, information from the test is capable of being recorded against the location 32 and intensity of the electromagnetic interference. Such modifications and enhancements are intended to belong to various embodiments of the invention.

What is claimed is:

1. A method for obtaining electromagnetic data from a circuit board, a set of sensing locations residing in a plane which is substantially parallel to the circuit board, the method comprising:
    moving a probe to a first sensing location residing in the plane and collecting first electromagnetic data using the probe;
    moving the probe from the first sensing location residing in the plane to a second sensing location residing in the plane and collecting second electromagnetic data using the probe; and
    providing an electromagnetic data output based on the first and second electromagnetic data,
    wherein a robotic assembly couples to the probe, and wherein moving the probe from the first sensing location residing in the plane to the second sensing location residing in the plane and collecting the second electromagnetic data using the probe includes:
        outputting an actuation signal to the robotic assembly to position the probe at the second sensing location;
        receiving a confirmation signal from the robotic assembly to confirm that the probe is positioned at the second sensing location; and
        detecting electromagnetic emissions from the circuit board using the probe while the probe is positioned at the second sensing location,
    and wherein a spectrum analyzer couples to the probe, and wherein detecting the electromagnetic emissions from the circuit board using the probe while the probe is positioned at the second sensing location includes:
        monitoring the electromagnetic emissions at the second sensing location using the spectrum analyzer.

2. A method as in claim 1 wherein the sensing locations are arranged in multiple rows and multiple columns within the plane to form a two-dimensional array; and wherein the first sensing location and the second sensing location reside in a same row and further reside in adjacent columns.

3. A method as in claim 2, further comprising:
    moving the probe to other sensing locations and collecting electromagnetic data at the other sensing locations using the probe to obtain, in a step-by-step manner, a database of electromagnetic data, the electromagnetic data output being derived from the database of electromagnetic data.

4. A method as in claim 3 wherein the circuit board is configured to repeat a pre-defined script of operations within a predetermined amount of time; and wherein robotic assembly is configured to hold the probe still at each sensing location for at least the predetermined amount of time.

5. A method as in claim 1 wherein monitoring the electromagnetic emissions includes:
    identifying a maximum amplitude of the electromagnetic emissions over a preset frequency range.

6. A method as in claim 5 wherein the preset frequency range is a user-selected one of a plurality of distinct preset frequency ranges, and wherein the present frequency range is about a preset center frequency being a user-selected one of a plurality of distinct center frequencies, and further comprising receiving a user selection of both the user-selected preset frequency range and the user-selected center frequency.

7. A method as in claim 5 wherein providing the electromagnetic data output includes:
    rendering a set of images on an output device, the set of images showing maximum amplitudes of electromagnetic emissions collected at each sensing location at multiple frequencies.

8. A method as in claim 7 wherein each of the images shows maximum amplitude of electromagnetic emissions collected at each sensing location over a respective distinct frequency range about a respective distinct center frequency.

9. A method as in claim 8 wherein the set of images are rendered sequentially in response to user selection of an animate menu selection.

10. A method as in claim 1 wherein the probe includes a first sense winding and a second sense winding, a portion of the first sense winding being substantially orthogonal to a portion of the second sense winding at an end of the probe; and wherein moving the probe from the first sensing location residing in the plane to the second sensing location residing in the plane and collecting second electromagnetic data using the probe includes:

positioning the portions of the first and second sense windings adjacent the circuit board at the second sensing location.

11. A method as in claim 10 wherein the portion of the first sense winding and the portion of the second sense winding are substantially flat and reside within the plane.

12. A system for obtaining electromagnetic data from a circuit board, a set of sensing locations residing in a plane which is substantially parallel to the circuit board, the system comprising:
a probe;
a robotic assembly coupled to the probe; and
a controller coupled to the probe and the robotic assembly, the controller being configured to:
move the probe to a first sensing location residing in the plane and collect first electromagnetic data using the probe;
move the probe from the first sensing location residing in the plane to a second sensing location residing in the plane and collect second electromagnetic data using the probe; and
provide an electromagnetic data output based on the first and second electromagnetic data,
wherein the controller, when moving the probe from the first sensing location residing in the plane to the second sensing location residing in the plane and collecting the second electromagnetic data using the probe, is configured to:
output an actuation signal to the robotic assembly to position the probe at the second sensing location;
receive a confirmation signal from the robotic assembly to confirm that the probe is positioned at the second sensing location; and
detect electromagnetic emissions from the circuit board using the probe while the probe is positioned at the second sensing location,
and wherein the controller includes:
a spectrum analyzer coupled to the probe, the spectrum analyzer being configured to monitor electromagnetic emissions at the sensing locations using the probe.

13. A system as in claim 12 wherein the sensing locations are arranged in multiple rows and multiple columns within the plane to form a two-dimensional array; and wherein the first sensing location and the second sensing location reside in a same row and further reside in adjacent columns.

14. A system as in claim 13 wherein the controller is further configured to:
move the probe to other sensing locations and collect electromagnetic data at the other sensing locations using the probe to obtain, in a step-by-step manner, a database of electromagnetic data, the electromagnetic data output being derived from the database of electromagnetic data.

15. A system as in claim 14 wherein the circuit board is configured to repeat a pre-defined script of operations within a predetermined amount of time; and wherein the controller is configured to direct the robotic assembly to hold the probe still at each sensing location for at least the predetermined amount of time.

16. A system as in claim 12 wherein the spectrum analyzer, when monitoring the electromagnetic emissions at the sensing locations using the probe, is configured to:
identifying a maximum amplitude of the electromagnetic emissions over a preset frequency range at each of the sensing locations.

17. A system as in claim 16 wherein the preset frequency range is a user-selected one of a plurality of distinct preset frequency ranges, and wherein the present frequency range is about a preset center frequency being a user-selected one of a plurality of distinct center frequencies, and wherein the controller is configured to receive a user selection of both the user-selected preset frequency range and the user-selected center frequency.

18. A system as in claim 16 wherein the controller, when providing the electromagnetic data output, is configured to:
render a set of images on an output device, the set of images showing maximum amplitudes of electromagnetic emissions collected at each sensing location at multiple frequencies.

19. A system as in claim 18 wherein each of the images shows maximum amplitude of electromagnetic emissions collected at each sensing location over a respective distinct frequency range about a respective distinct center frequency.

20. A system as in claim 19 wherein the controller is configured to render the images sequentially in response to user selection of an animate menu selection.

21. A system as in claim 12 wherein the probe includes a first sense winding and a second sense winding, a portion of the first sense winding being substantially orthogonal to a portion of the second sense winding at an end of the probe.

22. A system as in claim 21 wherein the portion of the first sense winding and the portion of the second sense winding are substantially flat and reside within the plane.

* * * * *